US012713534B2

(12) United States Patent
Mishra et al.

(10) Patent No.: US 12,713,534 B2
(45) Date of Patent: Aug. 18, 2026

(54) LEVER ACTUATED LOCKING MECHANISM

(71) Applicant: Eaton Intelligent Power Limited, Dublin (IE)

(72) Inventors: Adarsh Mishra, Pune (IN); Anzar Pandurang Rade, Pune (IN); Virginia Marie Merriam, Clay, NY (US)

(73) Assignee: EATON INTELLIGENT POWER LIMITED (IE)

( * ) Notice: Subject to any disclaimer, the term of this patent is extended or adjusted under 35 U.S.C. 154(b) by 237 days.

(21) Appl. No.: 18/461,596

(22) Filed: Sep. 6, 2023

(65) Prior Publication Data

US 2024/0080987 A1 Mar. 7, 2024

(30) Foreign Application Priority Data

Sep. 7, 2022 (IN) ............................ 202211051034

(51) Int. Cl.
*H05K 1/181* (2026.01)

(52) U.S. Cl.
CPC ... *H05K 1/181* (2013.01); *H05K 2201/10121* (2013.01); *H05K 2201/10598* (2013.01)

(58) Field of Classification Search
CPC .. H05K 5/00; H05K 5/04; H05K 5/06; H05K 7/14; H05K 7/18; H05K 1/11; F21V 17/002; F21V 17/10; F21V 17/164; F21V 19/004; F21Y 2115/10; F21Y 2115/30
USPC ................ 361/752–753, 756–759, 801–803
See application file for complete search history.

(56) References Cited

U.S. PATENT DOCUMENTS

| | | | | |
|---|---|---|---|---|
| 4,618,915 A * | 10/1986 | Bury | H05K 3/301 | 361/728 |
| 11,732,861 B2 * | 8/2023 | Ko | F21S 43/31 | 362/382 |
| 2005/0136715 A1 * | 6/2005 | Schlack | H05K 7/1409 | 439/160 |
| 2011/0038147 A1 * | 2/2011 | Lin | F21K 9/66 | 362/249.02 |
| 2016/0195249 A1 | 7/2016 | Liao et al. | | |
| 2021/0131647 A1 | 5/2021 | Baumeister et al. | | |
| 2022/0082220 A1 | 3/2022 | Wang et al. | | |

FOREIGN PATENT DOCUMENTS

| | | |
|---|---|---|
| CN | 207298579 U | 5/2018 |
| CN | 210462522 U | 5/2020 |
| EP | 3150908 A1 | 4/2017 |

OTHER PUBLICATIONS

International Search Report issued in corresponding application No. PCT/EP2023/025393 dated Nov. 22, 2023, 3 pages.
Written Opinion issued in corresponding application No. PCT/EP2023/025393 dated Nov. 22, 2023, 6 pages.

* cited by examiner

*Primary Examiner* — Tuan T Dinh
(74) *Attorney, Agent, or Firm* — Merchant & Gould P.C.

(57) ABSTRACT

A lever actuated locking mechanism for attaching an optical element to a printed circuit board assembly. The locking mechanism includes a first arm extending from a side edge of an opening formed in the optical element. A locking tab protrudes from one side of a distal end of the first arm. A first actuating lever arm extends from a mid-portion of the first arm. An actuating lever connects to a distal end of the first actuating lever arm, wherein applying pressure to the actuating lever causes the locking tab to pivot about a point where the first arm is attached to the side edge of the opening.

20 Claims, 4 Drawing Sheets

16
72
66
62

16
72
66
62

LEVER ACTUATED LOCKING MECHANISM

FIELD

The subject application relates to mounting an optical element in a light assembly. More particularly, a locking mechanism for selectively locking and unlocking an optical element to an enclosure of a light assembly.

BACKGROUND

Light assemblies find particular application in illuminating large areas. Some light assemblies are specially designed to provide illumination in a wide range of harsh and hazardous environments. These light assemblies are designed to include features that are selected to withstand the conditions of the harsh and hazardous environment. However, the features that are utilized on these light assemblies are often time consuming (during manufacturing) and require excess components, e.g., fasteners, adhesives, etc. Each of these additional components must be accounted for, e.g., tracked and stored by the manufacturing facility.

There is a need for a locking mechanism for securing an optical element, such as a reflector or a refractor, to a light assembly that allows for repeated and reliable attachment to and detachment from a housing of the light assembly without the use of tools.

The present invention provides a lever actuated locking mechanism that meets the requirements of use in harsh and hazardous environments while allowing for repeated and reliable attachment and detachment without the use of tools.

SUMMARY OF THE INVENTION

There is provided a lever actuated locking mechanism for attaching an optical element to a printed circuit board assembly. The locking mechanism includes a first arm extending from a side edge of an opening formed in the optical element. A locking tab protrudes from one side of a distal end of the first arm. A first actuating lever arm extends from a mid-portion of the first arm. An actuating lever connects to a distal end of the first actuating lever arm, wherein applying pressure to the actuating lever causes the locking tab to pivot about a point where the first arm is attached to the side edge of the opening.

In the foregoing mechanism, a second arm extends from the side edge of the opening formed in the optical element and a bridge connects distal ends of the first arm and the second arm to each other.

In the foregoing mechanism, a second actuating lever arm extends from a mid-portion of the second arm, wherein the actuating lever connects the distal end of the first actuating lever arm to the distal end of the second actuating lever arm.

In the foregoing mechanism, the locking tab protrudes from one side of the bridge.

There is further provided, a light assembly including an enclosure defining a receiving cavity. A printed circuit board assembly is attached to a lower surface defining the receiving cavity. An optical element is disposed within the receiving cavity and is connected to the printed circuit board assembly. The optical element includes a lever actuated locking mechanism which as a first arm extending from a side edge of an opening formed in the optical element. A locking tab protrudes from one side of a distal end of the first arm, A first actuating lever arm extends from a mid-portion of the first arm. An actuating lever is connected to a distal end of the first actuating lever arm, wherein applying pressure to the actuating lever causes the locking tab to pivot about a point where the first arm is attached to the side edge of the opening.

In the foregoing assembly, a second arm extends from the side edge of the opening formed in the optical element and a bridge connects distal ends of the first arm and the second arm to each other.

In the foregoing assembly, a second actuating lever arm extends from a mid-portion of the second arm, wherein the actuating lever connects the distal end of the first actuating lever arm to the distal end of the second actuating lever arm.

In the foregoing assembly, the locking tab protrudes from one side of the bridge.

In the foregoing assembly, the enclosure further includes a pocket dimensioned to receive the distal end of the first arm and the locking tab.

In the foregoing assembly, the locking tab is configured to engage an edge of the printed circuit board assembly for securing the optical element to the printed circuit board assembly.

In the foregoing assembly, the optical element includes two or more lever actuated locking mechanisms.

In the foregoing assembly, the lever actuated locking mechanism is detachable from the edge of the printed circuit board assembly.

DETAILED DESCRIPTION

The following presents a description of the disclosure; however, aspects may be embodied in many different forms and should not be construed as limited to the embodiments set forth herein. Furthermore, the following examples may be provided alone or in combination with one or any combination of the examples discussed herein.

Figure 1:
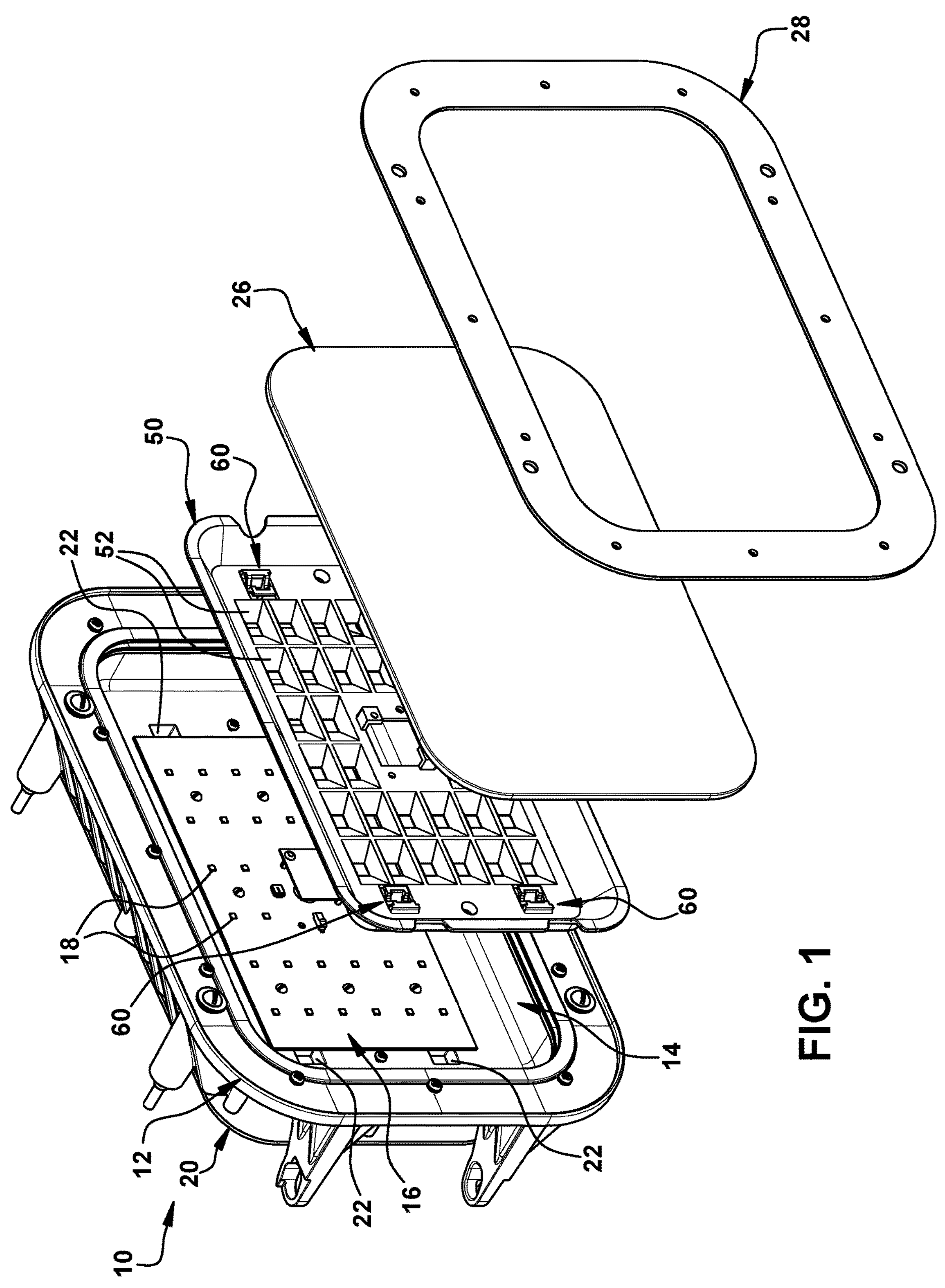
FIG. 1 is exploded view of a light assembly.

As shown in FIG. 1, a light assembly 10 includes an enclosure 12, a printed circuit board assembly (PCBA) 16, an optical element 50 and an outer window 26. The enclosure 12 includes a recessed cavity 14 that is configured to receive the PCBA 16 and the optical element 50. In the embodiment illustrated, the PCBA 16 includes a plurality of light emitting diodes (LEDs) 18 that are configured to emit light of a predetermined wavelength. An intermediate plate 20 is located behind the enclosure 12 and functions as a cover for another housing (not shown).

The optical element 50 includes a plurality of prismatic recesses 52. Each prismatic recess 52 is dimensioned to be positioned above an LED 18 when the optical element 50 is attached to the PCBA 16. The optical element 50 includes a plurality of a lever actuated locking mechanisms 60 that are described in detail below. Each mechanism 60 is dimensioned and positioned to align with a pocket 22 formed in the enclosure 12.

The outer window 26 is attached to the enclosure 12 to enclose the PCBA 16 and the optical element 50 in the recessed cavity 14 of the enclosure 12. The outer window 26 is made from a translucent material to allow light emitting from the LEDs 18 to exit the light assembly 10. A frame 28 is provided for securing the outer window 26 to the enclosure 12.

The optical element 50 includes a plurality of the lever actuated locking mechanisms 60. One locking mechanism 60 will be described below and the description applies to each of the locking mechanisms 60 of the optical element 50. In the embodiment illustrated, the optical element 50 includes four lever actuated locking mechanisms 60.

Figure 2:
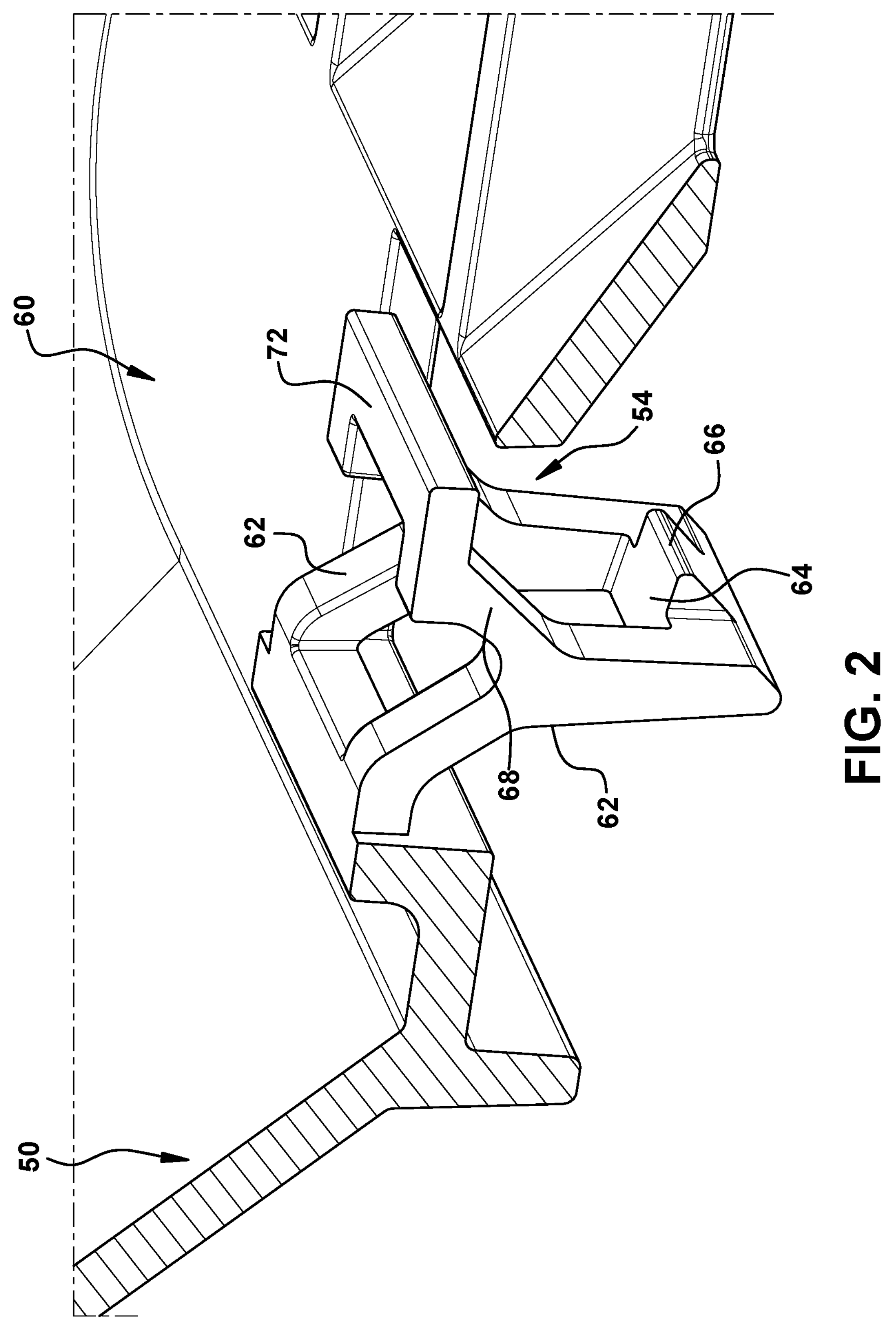
FIG. 2 is an enlarged view of a lever actuated locking mechanism of an optical element illustrating the optical element attached to an enclosure of the light assembly of FIG. 1.

Referring to FIG. 2, the lever actuated locking mechanism 60 is illustrated as an integrated feature of the optical element 50. In particular, it is contemplated that the locking mechanism 60 may be formed, e.g., injection molded, using a single core. It is contemplated that the locking mechanism 60 may be sized based on the PCBA 16 to which the optical element 50 is attached.

The locking mechanism 60 is positioned within a cavity 54 formed in the optical element 50. In the embodiment illustrated, the cavity 54 is generally rectangular-in-shape. A connecting arm 62 extends from a side edge of the cavity 54. The connecting arm 62 has an optimum material stiffness level allowing for repeated installation and removal without fracture or deformity. In the embodiment illustrated, two connecting arms 62 extend downwardly into the cavity 54 and protrude from the lower surface of the optical element 50. A bridge 64 connects the distal ends of the connecting arms 62 to each other. A locking tab 66 extends from one side of the bridge 64 and is positioned and dimensioned to engage an edge of the PCBA 16 (FIG. 1), as described in detail below.

An actuating lever arm 68 extends from each connecting arm 62. In the embodiment illustrated, the actuating lever arms 68 extend from a middle portion of the connecting arm 62. An actuating lever 72 connects the distal ends of the actuating lever arms 68 to each other.

Figure 3:
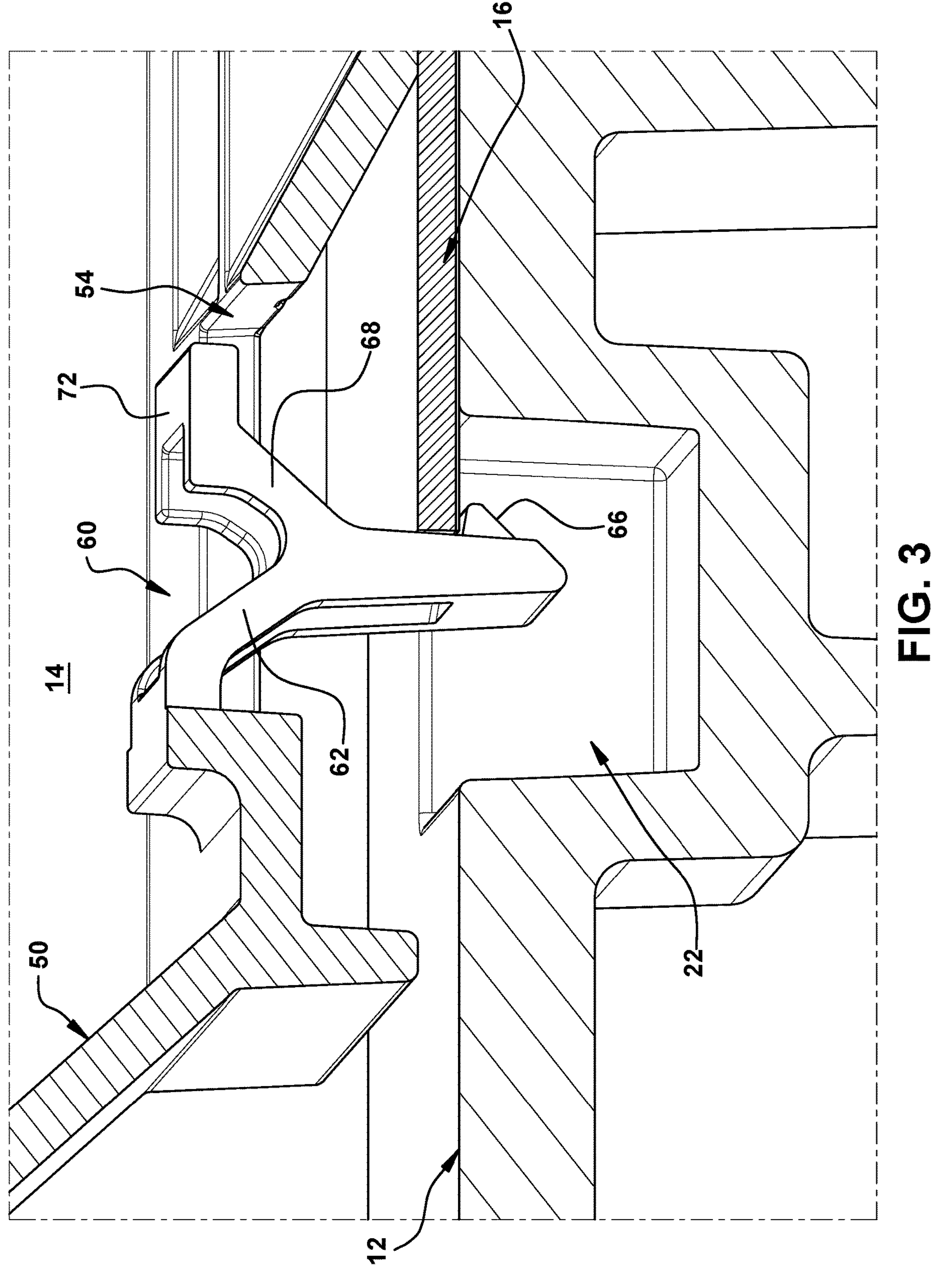
FIG. 3 is an enlarged perspective view of the lever actuated locking mechanism of FIG. 2.
Figures 4A, 4B:
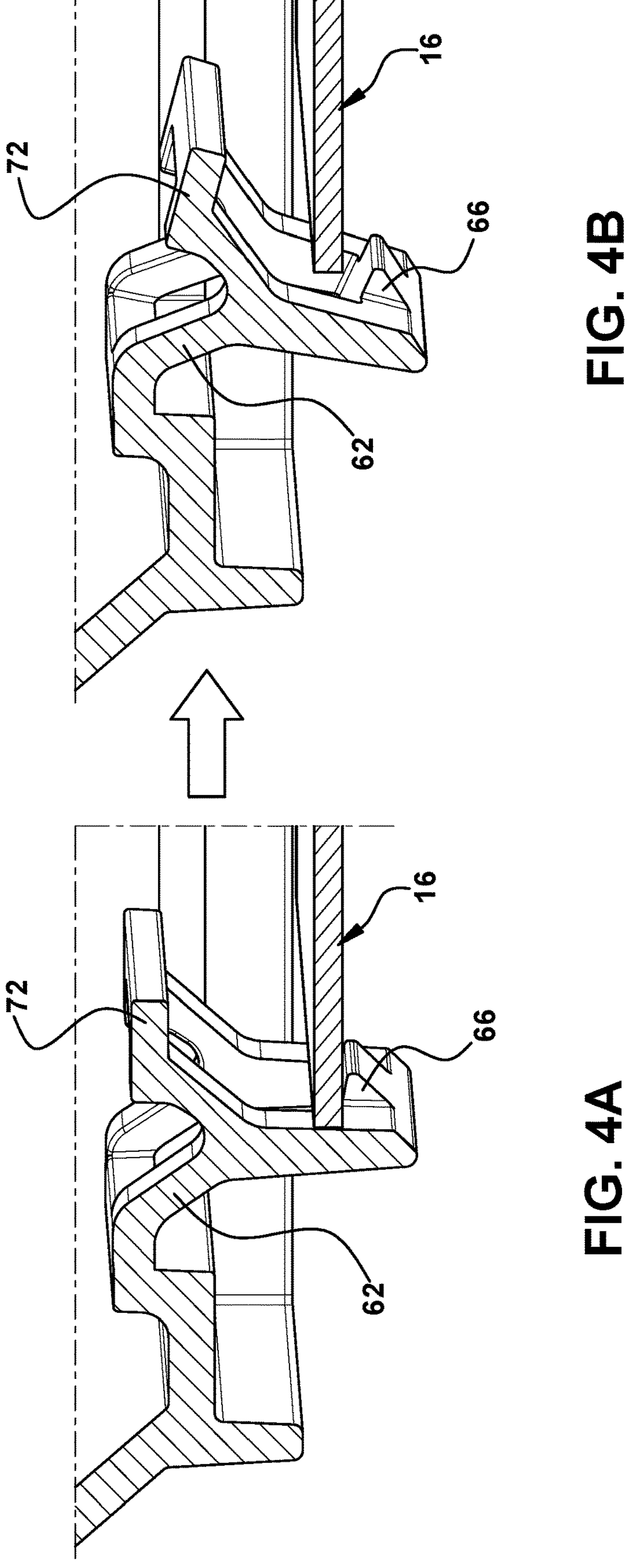
FIG. 4A illustrates the lever actuated locking mechanism of FIG. 2 in an unactuated position.
FIG. 4B illustrated the lever actuated locking mechanism of FIG. 2 in an actuated position.

The lever actuated locking mechanism 60 will now be described in relation to the operation of the same. Referring to FIG. 3, the PCBA 16 is disposed in the recessed cavity 14 of the enclosure 12. As illustrated in FIG. 3, the PCBA 16 may rest on a bottom surface of the recessed cavity 14. The optical element 50 is then positioned adjacent the PCBA 16 such that each lever actuated locking mechanism 60 aligns with the pocket 22 of the enclosure 12. As the optical element 50 approaches the pocket 22 and the PCBA 16, pressure is applied to the actuating lever 72 such that the locking tab 66 pivots to an insertion angle, as illustrated in FIG. 4. In particular, the locking mechanism 60 pivots about the point where the connecting arms 62 attach to the edge of the optical element 50 defining the cavity 54. As the locking mechanism 60 pivots, the locking tab 66 moves away from the edge of the PCBA 16 until the locking tab 66 is past the edge of the PCBA 16. When the locking mechanism 60 is in this pivoted position, it is referred to as being in an unlocked position.

Once the locking tab 66 is below the edge of the PCBA 16, the pressure on the actuating lever 72 is released to allow the locking mechanism 60 to pivot to a locked position. In the locked position, the upper surface of the tab 66 is below and adjacent to the lower surface of the PCBA 16. In this position, the locking tab 66 prevents the optical element 50 from being disconnected from the PCBA 16.

In order for a user to remove the optical element 50 from the PCBA 16, each lever actuated locking mechanism 60 must be forced to its unlocked position at a retraction angle such that the respective tabs 66 may pass by the edge of the PCBA 16 as the optical element 50 is moved away from the PCBA 16.

The present apparatus thereby provides a lever actuated locking mechanism that allows an optical element to be easily and repeatably attached to and detached from a PCBA. The locking mechanism is integral with the optical element and requires no extra fasteners to secure the optical element to the PCBA. As compared to other conventional optical elements that utilize fasteners to attach the optical element to the PCBA, the present apparatus requires no such fasteners.

It will be apparent to those skilled in the art that various modifications and variations can be made without departing from the spirit and scope of the claimed invention.

The invention claimed is:

1. A lever actuated locking mechanism for attaching an optical element to a printed circuit board assembly, the lever actuated locking mechanism comprising:

a first arm extending from a side edge of an opening formed in the optical element;

a locking tab protruding from one side of a distal end of the first arm;

a first actuating lever arm extending from a mid-portion of the first arm; and an actuating lever connected to a distal end of the first actuating lever arm, wherein applying pressure to the actuating lever causes the locking tab to pivot about a point where the first arm is attached to the side edge of the opening.

2. The lever actuated locking mechanism of claim 1, further comprising a second arm extending from the side edge of the opening formed in the optical element and a bridge connecting distal ends of the first arm and the second arm to each other.

3. The lever actuated locking mechanism of claim 1, wherein the mid-portion of the first arm is spaced intermediate the locking tab and the side edge.

4. The lever actuated locking mechanism of claim 1, wherein the lever actuated locking mechanism is positioned within the opening formed in the optical element, wherein the side edge is a first side edge, and wherein the actuating lever extends towards a second side edge of the opening that is opposite the first side edge.

5. The lever actuated locking mechanism of claim 1, wherein the locking tab and the actuating lever deflect in a common direction when pressure is applied to the actuating lever.

6. The lever actuated locking mechanism of claim 1, wherein the first actuating lever arm cooperates with the first arm to form a Y-shape.

7. The lever actuated locking mechanism of claim 2, further comprising a second actuating lever arm extending from a mid-portion of the second arm, wherein the actuating lever connects the distal end of the first actuating lever arm to a distal end of the second actuating lever arm.

8. The lever actuated locking mechanism of claim 2, wherein the locking tab protrudes from one side of the bridge.

9. A light assembly comprising:

an enclosure defining a receiving cavity;

a printed circuit board assembly attached to a lower surface defining the receiving cavity; and an optical element disposed within the receiving cavity and connected to the printed circuit board assembly, wherein the optical element includes a lever actuated locking mechanism comprising:

a first arm extending from a side edge of an opening formed in the optical element;

a locking tab protruding from one side of a distal end of the first arm;

a first actuating lever arm extending from a mid-portion of the first arm; and an actuating lever connected to a distal end of the first actuating lever arm, wherein applying pressure to the actuating lever causes the locking tab to pivot about a point where the first arm is attached to the side edge of the opening.

10. The light assembly of claim 9, further comprising a second arm extending from the side edge of the opening formed in the optical element and a bridge connecting distal ends of the first arm and the second arm to each other.

11. The light assembly of claim 9, wherein the enclosure further comprising a pocket dimensioned to receive the distal end of the first arm and the locking tab.

12. The light assembly of claim 9, wherein the locking tab is configured to engage an edge of the printed circuit board assembly for securing the optical element to the printed circuit board assembly.

13. The lever actuated locking mechanism of claim 9, wherein the mid-portion of the first arm is spaced intermediate the locking tab and the side edge.

14. The lever actuated locking mechanism of claim 9, wherein the lever actuated locking mechanism is positioned within the opening formed in the optical element, wherein the side edge is a first side edge, and wherein the actuating lever extends towards a second side edge of the opening that is opposite the first side edge.

15. The lever actuated locking mechanism of claim 9, wherein the locking tab and the actuating lever deflect in a common direction when pressure is applied to the actuating lever.

16. The lever actuated locking mechanism of claim 9, wherein the first actuating lever arm cooperates with the first arm to form a Y-shape.

17. The light assembly of claim 10, further comprising a second actuating lever arm extending from a mid-portion of the second arm, wherein the actuating lever connects the distal end of the first actuating lever arm to a distal end of the second actuating lever arm.

18. The light assembly of claim 10, wherein the locking tab protrudes from one side of the bridge.

19. The light assembly of claim 12, wherein the optical element including two or more lever actuated locking mechanisms.

20. The light assembly of claim 12, wherein the lever actuated locking mechanism is detachable from the edge of the printed circuit board assembly.

* * * * *